United States Patent
Marx et al.

(10) Patent No.: US 6,724,184 B1
(45) Date of Patent: Apr. 20, 2004

(54) DEVICE AND METHOD FOR DETERMINING A MAGNETIC FIELD AS TO ITS INTENSITY AND DIRECTION

(75) Inventors: Klaus Marx, Stuttgart (DE); Hartmut Kittel, Weissach-Flacht (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/890,367
(22) PCT Filed: Jan. 26, 2000
(86) PCT No.: PCT/DE00/00211
§ 371 (c)(1), (2), (4) Date: Nov. 5, 2001
(87) PCT Pub. No.: WO00/45190
PCT Pub. Date: Aug. 3, 2000

(30) Foreign Application Priority Data

Jan. 28, 1999 (DE) .......................................... 199 03 296

(51) Int. Cl.$^7$ .............................................. G01R 33/12
(52) U.S. Cl. ...................................... 324/205; 324/202
(58) Field of Search ................................ 324/205, 228, 324/236, 258, 244, 260, 232, 202, 247; 335/222, 302; 33/361

(56) References Cited

U.S. PATENT DOCUMENTS

| | | | | | |
|---|---|---|---|---|---|
| 773,937 | A | * | 11/1904 | Holden ........................ | 324/205 |
| 2,624,783 | A | * | 1/1953 | Nedzel ........................ | 324/205 |
| 3,235,776 | A | * | 2/1966 | Ireland ........................ | 361/148 |
| 4,866,384 | A | | 9/1989 | Oetzmann .................... | 324/244 |
| 5,103,174 | A | | 4/1992 | Wandass et al. ............. | 324/244 |
| 5,126,669 | A | * | 6/1992 | Honess et al. ............... | 324/261 |
| 5,252,920 | A | * | 10/1993 | Date et al. .................... | 324/228 |
| 5,258,755 | A | * | 11/1993 | Kuckes ....................... | 340/853.5 |
| 5,859,754 | A | | 1/1999 | Rottmayer et al. .......... | 360/314 |

FOREIGN PATENT DOCUMENTS

| | | |
|---|---|---|
| DE | 44 08 078 | 9/1995 |
| DE | 195 43 562 | 5/1996 |
| EP | 0137896 | * 8/1983 |
| EP | 671 605 | 3/1995 |

OTHER PUBLICATIONS

Von E. Zabler et al., "Neue alternative Lösungen für Drehzahlsensoren im Kraftfahrzeug auf Magnetoresistiver Basis" (New Alternative Solutions for Speed Sensors on a magnetoresistive Basis in Motor Vehicles), VDI Report No. 509, 1984, pp. 263–268***.

M. Paranjape et al., "Simulation, Design and Fabrication of a Vertical Hall Device for Two Dimensional Magnetic Field Sensing", Sensors and Materials, 5, 2 (1993), pp. 91–101, MYU, Tokyo.

K. Eijkel, et al., "A Thin Film Magnetoresistive Angle Detector", Sensors and Actuators, A21–A23, 1990, pp. 795–798.

* cited by examiner

*Primary Examiner*—N. Le
*Assistant Examiner*—Reena Aurora
(74) *Attorney, Agent, or Firm*—Kenyon & Kenyon

(57) ABSTRACT

A device and a method for determining a magnetic field with respect to its intensity and direction at at least one detection location, and uses a first arrangement for superimposing an auxiliary magnetic field, known at least in intensity, on the magnetic field, and a second arrangement for measuring at least the direction of the magnetic field resulting from the superimposition of the magnetic field to be determined and of the auxiliary magnetic field at the detection location. The magnetic field is determined at the detection location in that the resultant magnetic field produced by the magnetic field to be determined and the auxiliary magnetic field is determined with respect to its direction for at least two different auxiliary magnetic fields; and the magnetic field to be determined is calculated therefrom. The method is especially suited for determining the intensity and direction of a magnetic field in the immediate vicinity of the surface of a magnet.

17 Claims, 1 Drawing Sheet

DEVICE AND METHOD FOR DETERMINING A MAGNETIC FIELD AS TO ITS INTENSITY AND DIRECTION

FIELD OF THE INVENTION

The present invention relates to a device and a method for determining a magnetic field, in particular with respect to its intensity and direction in the immediate vicinity of a magnet surface.

BACKGROUND INFORMATION

Magnetic fields or magnetic field components that emerge orthogonally to magnet surfaces can be measured using Hall probes or magnetoresistors as sensors, since they are responsive to magnetic field components that are oriented perpendicularly to the sensor surface. However, the magnetic field components that run in parallel to the magnet surfaces may only be routinely measured by these sensors at relatively large intervals of "typically" a few millimeters, since adjustment of the sensors may be required in a direction normal to the magnet surface.

Measuring methods and measuring sensors that function on the basis of the Hall effect are discussed, for example, in the essay "Neue alternative Lösungen für Drehzahlsensoren im Kraftfahrzeug auf magnetoresistiver Basis" (New Alternative Solutions for Speed Sensors on a Magnetoresistive Basis in Motor Vehicles) from VDI report no. 509, 1984, VDI Publishers. Hall sensors for sensing fields directed tangentially to the magnet surface are also referred to in "Sensors and Materials", 5, 2 (1992), pp. 91 through 101, MYU, Tokyo, and, in the essay included therein by M. Parajape, L. Ristic and W. Allegretto "Simulation, Design and Fabrication of a Vertical Hall Device for Two Dimensional Magnetic Field Sensing".

In addition to the sensors based on the Hall effect, so-called AMR and GMR angular-position sensors, which are based on the so-called magnetoresistive effect (GMR= giant magneto resistance, AMR=anisotropic magneto resistance), can be used to measure a magnetic field component directed in parallel to the sensor surface.

Sensors of this kind, which are discussed, for example, in German Published Patent Application No. 195 43 562 and German Published Patent Application No. 44 08 078, may be essentially only sensitive, within their operative range, to the direction of the magnetic field to be measured and, only to a slight extent, to its intensity. At the same time, the measured amplitude of a sensor of this kind may be substantially temperature-dependent, which may lead to significant measuring errors. On the other hand, AMR or GMR angular-position sensors may exhibit an angular accuracy of about 0.50 (i.e., the measuring accuracy for determining the direction of an external magnetic field to be measured by the sensor). This angular measurement may be only negligibly temperature-dependent, in contrast to the intensity measurement.

At the same time, however, these sensors may have the advantage of also being able to be used, for example, in the direct proximity of the surface of a magnet that produces the magnetic field to be measured, i.e., typically at a distance of less than 1 mm. In this regard, reference is again made to "Neue alternative Lösungen für Drehzahlsensoren im Kraftfahrzeug auf magnetoresistiver Basis" (New Alternative Solutions for Speed Sensors on a Magnetoresistive Basis in Motor Vehicles) from VDI report no. 509, 1984, VDI Publishers.

The functioning of AMR and GMR angular position sensors and their use for measuring magnetic fields is also referred to in Sensors and Actuators, A21–A23, "A Thin Film Magnetoresistive Angle Detector", 1990, pp. 795 through 798.

SUMMARY OF THE INVENTION

An exemplary embodiment and/or exemplary method in accordance with the present invention for determining a magnetic field is believed to have the advantage of allowing the determination of, for the most part, any magnetic fields whatsoever with respect to their intensity and direction, at a selected detection location. Particularly advantageous in this context is that magnetic fields or magnetic field components, which are directed in parallel to, or emerge from, the surface, for example, of a magnet producing these magnetic field components, can be measured very closely to the surface of this magnet.

Thus, as an auxiliary magnetic field required for measuring the magnetic field of interest, i.e., to be determined, one can initially use an arbitrarily produced auxiliary magnetic field, which, must be known, however, at least with respect to its intensity, preferably with respect to its intensity and direction. A Helmholtz coil pair may be advantageously suited for producing this auxiliary magnetic field. The center has a homogenous magnetic field, whose intensity and direction are known, and which can be adjusted in a defined and simple fashion, for example, by way of the coil current.

To detect the magnetic field resulting from the superimposing of the auxiliary magnetic field and the magnetic field to be measured, with respect to its direction, an AMR or GMR angular position sensor that may be commercially available, may be used.

In this context, a device, such as a coil having a defined and variable magnetic field that can be produced by the coil, is integrated at the same time in the AMR or GMR angular position sensor, to produce the auxiliary magnetic field, thereby eliminating the need for an external component, such as the mentioned Helmholtz coil pair.

Moreover, before commencing with the measurement of the magnetic field of interest (target magnetic field), that flows out, for example, from the surface of a magnet, the GMR or AMR angular position sensor used can be utilized for calibration or test measurements. This is done initially, in the absence of this magnet, in that the generated auxiliary magnet field is measured or calibrated by the GMR or AMR angular position sensor at the particular detection location, with respect to intensity, or with respect to intensity and direction, for various parameter adjustments, to produce the auxiliary magnetic field. Alternatively, to measure the auxiliary magnetic field, a Hall sensor can also be used, however. Thus, in the subsequent measurement of the magnetic field to be determined, for which then, for example, the magnet producing the magnetic field to be determined, is placed at the detection location in question, the auxiliary magnetic field is known in each case for the various parameter adjustments of the auxiliary magnetic field (for example of the coil current).

The magnetic field of interest is determined using the known auxiliary magnetic field, by calculating the magnetic field to be measured from the direction, measured at the detection location, of the resulting magnetic field produced from the superimposition of the auxiliary magnetic field and the magnetic field to be measured.

To this end, the direction of the resulting magnetic field is determined for at least two auxiliary magnetic fields, at the detection location with respect to their various auxiliary magnetic fields, and the magnetic field to be measured is calculated therefrom with respect to its intensity and direction, employing any suitably appropriate numerical adaptation method, which in one exemplary embodiment is carried out or performed with the assistance of a computer program. This numerical adaptation may be carried out to improve the numerical stability and the measuring accuracy using measuring data, from a multiplicity of determinations of the resulting magnetic field, given in each case various auxiliary fields. Furthermore, with respect to measuring accuracy and numerical considerations, it is believed to be beneficial for the auxiliary magnetic fields to be oriented in each case roughly perpendicularly to the assumed direction of the magnetic field to be measured.

The exemplary method according to the present invention may be suited for determining a magnetic field emerging from a surface of a magnet, as well as, in particular, for determining a magnetic field directed substantially in parallel to the surface of a magnet, in direct proximity to the surface of this magnet. It may be routinely employed, for example, in the quality testing of magnets.

DETAILED DESCRIPTION

Figure 1:
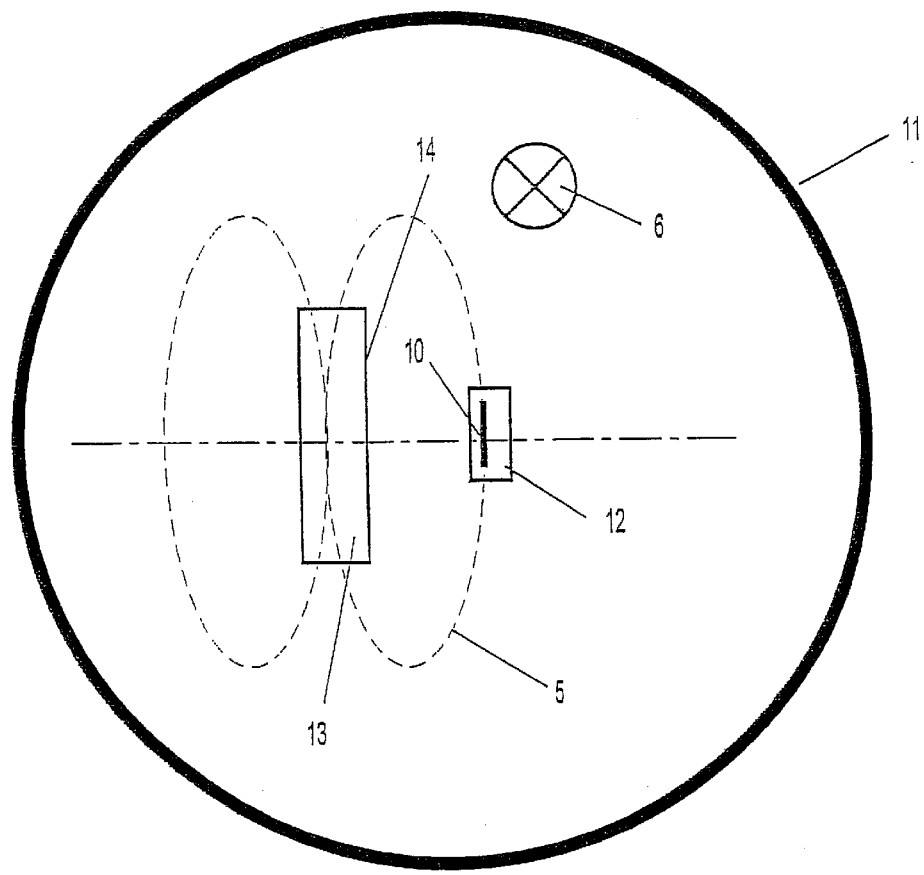
FIG. 1 shows a device for measuring a magnetic field.

FIG. 1 illustrates a magnet 13 having a surface 14, from which a magnetic field 5 to be measured (shown schematically in FIG. 1) emerges, which also exhibits, in particular, magnetic field components running in parallel to surface 14. In addition, a Helmholtz coil pair 11 is provided, which produces an auxiliary magnetic field 6 (indicated schematically by its direction in FIG. 1), whose intensity is adjustable by external parameters, such as a coil current. Magnet 13 is situated roughly in the center of Helmholtz coil pair 11. Also provided is a commercially available AMR angular position sensor 12. In the exemplary embodiment, it is an angular position sensor KMZ41 of the firm Philips Semiconductors, Hamburg. In place of the AMR angular-position sensor, however, a commercially available GMR angular-position sensor may be used.

AMR angular-position sensor 12 is situated at detection location 10, which, in turn, is in the immediate vicinity of surface 14 of magnet 13. The distance between detection location 10 and surface 14, in particular, may be 0.3 mm to 3 mm. The lower proximity limit is restricted here only by the thickness of the housing of AMR angular-position sensor 12.

At this point, reference is made to the fact that FIG. 1 is not according to scale, since the diameter of Helmholtz coil pair 11 is substantially larger than the distance of surface 14 from detection location 10. Thus, the differences in the intensity and direction of auxiliary magnetic field 6 between detection location 10 and surface 14 may be considered negligible.

Figure 2:
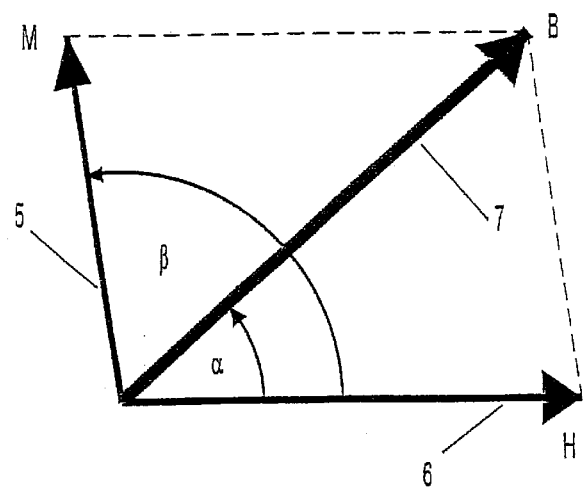
FIG. 2 shows the designations and directions of the various occurring magnetic fields.

FIG. 2 illustrates the directions of the occurring magnetic fields, which are shown as vectors and are each identified by amount, i.e., intensity, and direction. First, auxiliary magnetic field 6, also denoted by H, is produced via Helmholtz coil pair 11. Magnetic field 5, also denoted by M, emerges from magnet 13. In this instance, auxiliary magnetic field 6 may be initially oriented above the arrangement of Helmholtz coil pair 11 such that its direction is more or less normal to the assumed direction of magnetic field 5 to be measured.

From the superimposition of magnetic field 5 to be measured and of auxiliary magnetic field 6, a resulting magnetic field 7 is formed at detection location 10, the resulting magnetic field being rotated with respect to magnetic field 5 to be measured and auxiliary magnetic field 6, and also being denoted by B. The angle between the direction of auxiliary magnetic field 6 and resulting magnetic field 7 is denoted by α. The initially unknown direction of magnetic field 5 to be measured is denoted by angle β, which is likewise related to the direction of auxiliary magnetic field 6.

To determine magnetic field 5, auxiliary magnetic field 6 must first be known, with respect to its strength or with respect to its strength and direction at detection location 10. This is done, for example, by measuring or calibrating the magnetic field of Helmholtz coil pair 11, before introducing magnet 13 into its field, through the use of a Hall probe and/or a generally known GMR or AMR angular-position sensor. However, the specific method employed to determine or calibrate auxiliary magnetic field 6 in these test or calibration measurements may include any suitably appropriate method. In addition, the intensity of auxiliary magnetic field 6 must be able to be varied in defined fashion, for example by adjusting an external parameter, such as a coil current that generates auxiliary magnetic field 6.

The exemplary measuring method involves the fact that selectively (definably) superimposing auxiliary magnetic field 6 at detection location 10 rotates the direction of resulting magnetic field 7 with respect to the direction of magnetic field 5 to be measured and the direction of auxiliary magnetic field 6. This rotation is dependent upon the intensity of auxiliary magnetic field 6, but also upon the intensity of magnetic field 5 to be measured. From knowledge of the intensity or the intensity and direction of auxiliary magnetic field 6, as well as of the measurement of angle of rotation a, the intensity and the direction of field 5 to be measured may be calculated or determined.

In this context, the following relation applies from the vector summation of the individual magnetic fields:

$$M \cos(\beta) \tan(\alpha) + H \tan(\alpha) - M \sin(\beta) = 0 \qquad (1).$$

β is the initially unknown angle, specifying the direction of magnetic field 5 to be measured, which likewise initially has an unknown intensity M.

In equation (1), intensity H of auxiliary magnetic field 6 is known. As described, it was determined in advance in a measurement using a Hall probe. In addition, angle α, and thus the direction of resulting magnetic field 7 in relation to the direction of auxiliary magnetic field 6 is able to be measured using AMR angular-position sensor 12. This may be accomplished by using the sine-cosine analysis referred to in German Pubished Patent Application No. 195 43 562. To simplify the further procedure, it may be beneficial in this context, when, besides the intensity, one knows the direction of auxiliary magnetic field 6 as well, since angle a relates specifically to this direction.

Overall, therefore, given a known auxiliary magnetic field, equation 1 contains two unknowns, namely β and M. To calculate this unknown, it may suffice to perform two measurements using two different auxiliary magnetic fields 6, i.e., two fields which vary in intensity.

To the extent that the direction of auxiliary magnetic field 6 should likewise be unknown in special cases, equation 1 also includes a third unknown. Accordingly, such a case requires at least three measurements, including auxiliary magnetic fields 6, which vary in intensity, but are each constant in direction, since the angle of resulting magnetic field 7 measured by AMR angular-position sensor 12 must then be based on the unknown, but constant direction of auxiliary magnetic field 6 and, as the case may be, to the reference angle defined by it. This additional complication may make it more difficult to determine β and M and, at the same time, may lead to more serious measuring errors. For that reason, this procedure may be disadvantageous when compared to auxiliary magnetic fields 6 which are known both with respect to intensity and direction.

To minimize the effect of measuring uncertainties, one may perform as many measurements as possible, or generally at least more than two or three, including varying intensities of auxiliary magnetic field 6, in order to obtain a multiplicity of equations (1), each with different measured values for H and α. From each of these equations, one may then determine the values for M and β, each of these being equivalent in all these equations, by employing a numerical adaptation (matching) method, e.g., an appropriate computer program. Therefore, one may obtain magnetic field 5 to be measured, with respect to intensity and direction.

The numerical stability of this adaptation method may depend on the number of measurements of various auxiliary magnetic fields 6 and on the size of angle α. In the case that auxiliary magnetic field 6 and magnetic field 5 to be measured are oriented perpendicularly to one another, the more closely a approaches 45°, the numerical stability of this adaptation method may be improved. In this case, the greatest directional difference may be apparent between magnetic field 5 to be measured and magnetic field 7 resulting from the superimposition. For that reason, it may be beneficial when the direction of auxiliary magnetic field 6 and the assumed direction of magnetic field 5 to be measured are oriented roughly perpendicular (orthogonal) to one another.

The measuring range of the measuring method clarified here and of the corresponding device may be approximately from 5 mT to 700 mT. In this context, the lower limit is predetermined by the GMR or AMR angular-position sensor 12 used, which may require a certain minimum field strength to at least substantially achieve its saturation magnetization. The upper limit is based on practical considerations, since the described device may only be able to produce distinctly larger fields with difficulty. In principle, however, it should be emphasized that, the exemplary measuring method should not be subject to any limitations with respect to the intensity of magnetic field 5 to be measured.

Comparison measurements have revealed that, at distances of approximately 4 mm to 12 mm to the surface of magnet 13, the intensities and directions of magnetic fields 5 emerging from the surface of magnets, determined using the described measuring method, may conform well to comparable measurements taken using suitably appropriate Hall probes that can likewise be employed for these distances. In this case, the measuring inaccuracy is generally less than 1 mT.

Since the specific generation of auxiliary magnetic field 6 is not significant, and it suffices when its intensity and direction are known at detection location 10, the exemplary embodiment described here may also be implemented by additionally providing for the employed AMR angular-position sensor 12 to include a device for generating the defined auxiliary magnetic field 6, or for AMR angular-position sensor 12 and a device for generating the auxiliary magnetic field 6 to be integrated in one component. In this case, one may do without Helmholtz coil pair 11 and the external magnetic field produced by it. The mentioned device can be a coil that may be integrated, for example, together with AMR angular-position sensor 12 in one component.

Besides the described GMR or AMR angular-position sensors, other sensors may be suited for implementing the described method, provided that the direction of resulting magnetic field 7 is measurable at detection location 10.

What is claimed is:

1. A device for use in determining at least one of a direction and an intensity of a magnetic field to be measured at a detection location, the device comprising:
    a first arrangement for superimposing an auxiliary magnetic field whose intensity is known on the magnetic field to be measured; and
    a second arrangement at the detection location for measuring the direction of a magnetic field resulting from superimposing the auxiliary magnetic field on the magnetic field to be measured.

2. The device of claim 1, wherein the first arrangement includes a Helmholtz coil pair.

3. The device of claim 1, wherein the first arrangement and the second arrangement are integrated in one component.

4. The device of claim 1, wherein the magnetic field to be measured is produced by a magnet and emerges from a surface of the magnet.

5. A device for use in determining at least one of a direction and an intensity of a magnetic field to be measured at a detection location, the device comprising:
    a first arrangement for superimposing an auxiliary magnetic field whose intensity is known on the magnetic field to be measured; and
    a second arrangement at the detection location for measuring at least the direction of a magnetic field resulting from superimposing the auxiliary magnetic field on the magnetic field to be measured;
    wherein the second arrangement includes at least one of a GMR angular-position sensor and an AMR angular-position sensor.

6. The device of claim 5, wherein the at least one of the GMR angular-position sensor and the AMR angular-position sensor includes a device for generating the auxiliary magnetic field.

7. A method for use in determining at least one of a direction and an intensity of a magnetic field to be measured at a detection location, the method comprising the steps of:
    superimposing an auxiliary magnetic field whose intensity is known on the magnetic field to be measured;
    determining a direction of another magnetic field resulting from superimposing the auxiliary magnetic field on the magnetic field to be measured; and
    repeating the steps of superimposing and determining for a different auxiliary magnetic field at the detection location.

8. The method of claim 7, wherein the magnetic field to be measured is produced by a magnet.

9. The method of claim 7, wherein the magnetic field to be measured emerges from a surface of a magnet, and the magnetic field is directed substantially parallel to and in direct proximity of the surface of the magnet.

10. A method for use in determining at least one of a direction and an intensity of a magnetic field to be measured at a detection location, the method comprising the steps of:

superimposing an auxiliary magnetic field whose intensity is known on the magnetic field to be measured;

determining a direction of another magnetic field resulting from superimposing the auxiliary magnetic field on the magnetic field to be measured; and repeating the steps of superimposing and determining for a different auxiliary magnetic field at the detection location;

wherein the direction of the magnetic field to be measured is calculated from determined directions of the another magnetic field.

11. The method of claim 10, wherein the direction of the magnetic field to be measured at the detection location is calculated using numerical adaptation and using intensities of the auxiliary magnetic field and the another auxiliary magnetic field.

12. The method of claim 11, wherein the steps of superimposing and determining are repeated for at least one other auxiliary magnetic field for improving a numerical stability of the numerical adaptation.

13. A method for use in determining at least one of a direction and an intensity of a magnetic field to be measured at a detection location, the method comprising the steps of:

superimposing an auxiliary magnetic field whose intensity is known on the magnetic field to be measured;

determining a direction of another magnetic field resulting from superimposing the auxiliary magnetic field on the magnetic field to be measured; and repeating the steps of superimposing and determining for a different auxiliary magnetic field at the detection location;

wherein determined directions of the another magnetic field and the magnetic field to be measured are different.

14. A method for use in determining at least one of a direction and an intensity of a magnetic field to be measured at a detection location, the method comprising the steps of:

superimposing an auxiliary magnetic field whose intensity is known on the magnetic field to be measured;

determining a direction of another magnetic field resulting from superimposing the auxiliary magnetic field on the magnetic field to be measured; and repeating the steps of superimposing and determining for a different auxiliary magnetic field at the detection location;

wherein a Helmholtz coil pair is used for producing the auxiliary magnetic field and the another auxiliary magnetic field.

15. A method for use in determining at least one of a direction and an intensity of a magnetic field to be measured at a detection location, the method comprising the steps of:

superimposing an auxiliary magnetic field whose intensity is known on the magnetic field to be measured:

determining a direction of another magnetic field resulting from superimposing the auxiliary magnetic field on the magnetic field to be measured: and repeating the steps of superimposing and determining for a different auxiliary magnetic field at the detection location;

wherein at least one of an AMR angular-position sensor and a GMR angular-position sensor is used for determining the directions of the another magnetic field.

16. The method of claim 15, wherein the auxiliary magnetic field and the another auxiliary magnetic field are produced by a device integrated in the at least one of the GMR angular-position sensor and the AMR angular-position sensor.

17. A method for use in determining at least one of a direction and an intensity of a magnetic field to be measured at a detection location, the method comprising the steps of:

superimposing an auxiliary magnetic field whose intensity is known on the magnetic field to be measured;

determining a direction of another magnetic field resulting from superimposing the auxiliary magnetic field on the magnetic field to be measured; and repeating the steps of superimposing and determining for a different auxiliary magnetic field at the detection location;

wherein the auxiliary magnetic field and the another auxiliary magnetic field are superimposed so that they are oriented at least approximately perpendicular to the magnetic field to be measured.

* * * * *